(12) United States Patent
Miller

(10) Patent No.: US 7,446,931 B2
(45) Date of Patent: Nov. 4, 2008

(54) COMPACT MULTICOLOR LIGHT BEAM SOURCE

(75) Inventor: Joshua O. Miller, Woodinville, WA (US)

(73) Assignee: Microvision, Inc., Redmond, WA (US)

(*) Notice: Subject to any disclaimer, the term of this patent is extended or adjusted under 35 U.S.C. 154(b) by 0 days.

(21) Appl. No.: 11/776,779

(22) Filed: Jul. 12, 2007

(65) Prior Publication Data

US 2008/0018987 A1    Jan. 24, 2008

Related U.S. Application Data

(60) Provisional application No. 60/832,539, filed on Jul. 20, 2006.

(51) Int. Cl.
  *G02F 2/02* (2006.01)
  *H01S 3/10* (2006.01)
(52) U.S. Cl. .............................. 359/326; 372/21; 372/23

(58) Field of Classification Search ......... 359/326–332; 372/6, 21, 23
See application file for complete search history.

(56) References Cited

U.S. PATENT DOCUMENTS

2007/0201120 A1* 8/2007 Tan et al. .................... 359/202
2008/0075130 A1* 3/2008 Mizuuchi et al. ............... 372/6

FOREIGN PATENT DOCUMENTS

WO    WO 2006006701 A1 *   1/2006

* cited by examiner

*Primary Examiner*—Hemang Sanghavi
(74) *Attorney, Agent, or Firm*—Kevin D. Wills

(57) ABSTRACT

A plural wavelength light beam source may include one or more integrated laser diodes and a wavelength-conversion source such as a second harmonic generation laser. According to some embodiments the one or more laser diodes may be aligned to emit light through a wavelength converter. According to some embodiments, a polarizer for selecting a pump wavelength polarization delivered to the wavelength converter may include a beam combining structure.

31 Claims, 16 Drawing Sheets

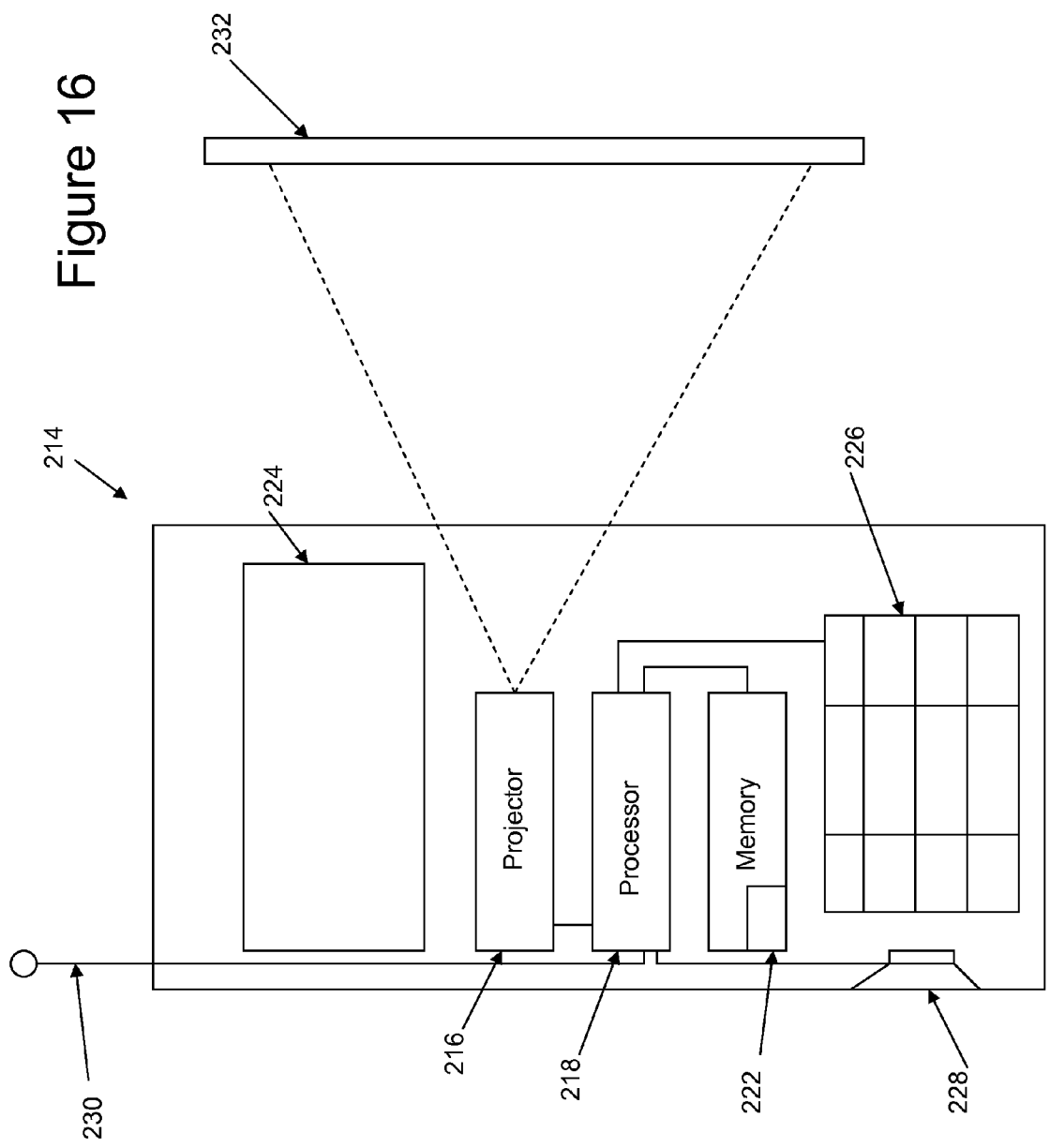

COMPACT MULTICOLOR LIGHT BEAM SOURCE

CROSS-REFERENCE TO RELATED APPLICATIONS

This application claims priority from U.S. provisional patent application No. 60/832,539, filed Jul. 20, 2006.

BACKGROUND

Light beams such as laser beams are used in a variety of applications including scanned beam displays and scanned beam image capture devices.

One approach to providing certain wavelengths of light is to use a wavelength converting material such as a second harmonic generation (SHG, aka frequency doubling) material to convert an input or pump beam of a first wavelength to an output beam having a different wavelength. For example, an SHG laser may include an infrared source that is operable to provide an input beam at 1064 nanometers (nm) that is received by the SHG material and frequency-doubled to a 532 nm green light output beam. Several wavelength converting materials are commercially available including, for example, potassium titanium oxide phosphate (KTP), periodically-polled lithium niobate (PPLN), rare earth-vanadate crystals, and non-linear organic (NLO) materials such as dyes.

Frequently it is desirable to provide plural wavelengths of light beams in a system. In one example, a 532 nm output beam provided by an SHG laser may be combined with red and blue beams of light produced by laser diodes to produce a red, green, and blue (RGB) composite output beam. Typically the beams may be combined using a beam combining device such as an X-cube beam combiner that receives beams at each of the input wavelengths and outputs a combined or composite output beam along an output axis.

The present disclosure provides improvements over the prior art such as with respect to size, cost, integration, power consumption, performance, etc.

OVERVIEW

According to an illustrative embodiment, a multicolor light beam source includes an SHG laser coupled with one or more laser diodes to produce a composite beam containing a plurality of wavelengths.

According to some embodiments, the one or more laser diodes launch beams through the wavelength converting material of the SHG laser to produce a composite beam at the output of the SHG that contains wavelengths associated with the one or more laser diodes and the SHG laser.

According to some embodiments, components of the SHG laser may be configured to provide beam-combining functionality.

According to some embodiments, a portion of a scanned beam device such as a scanned beam display, integrated photonics module, or scanned beam image capture device includes an SHG laser coupled with one or more laser diodes to produce a composite beam containing a plurality of wavelengths.

BRIEF DESCRIPTION OF THE DRAWINGS

FIG. 16 is a schematic block diagram of a device incorporated a projector implementing speckle reduction apparatus and methods in accordance with an embodiment of the present invention.

DETAILED DESCRIPTION

Figure 1:
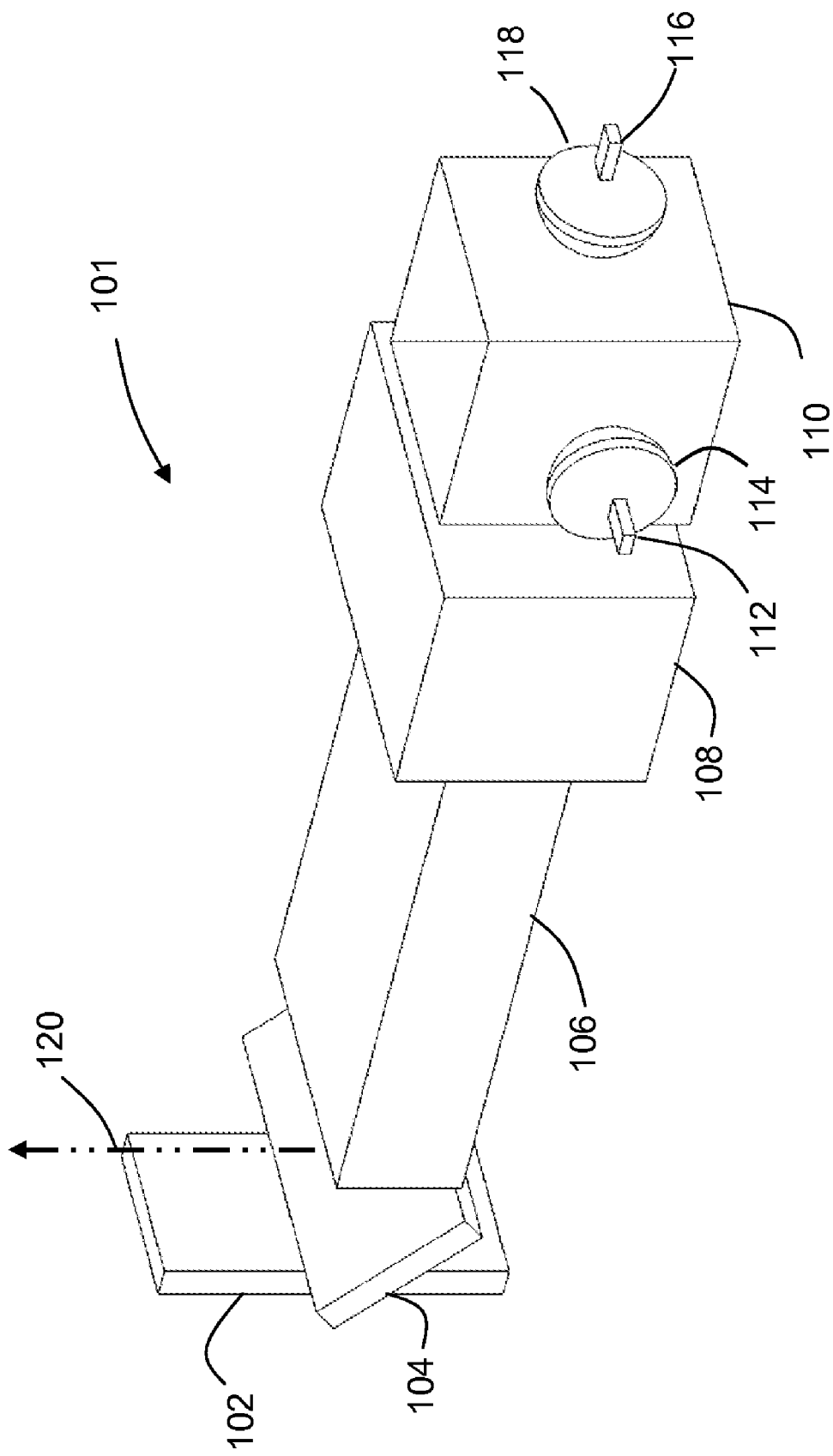
FIG. 1 is a perspective diagram of a plural wavelength light beam source according to an embodiment.
Figure 2:
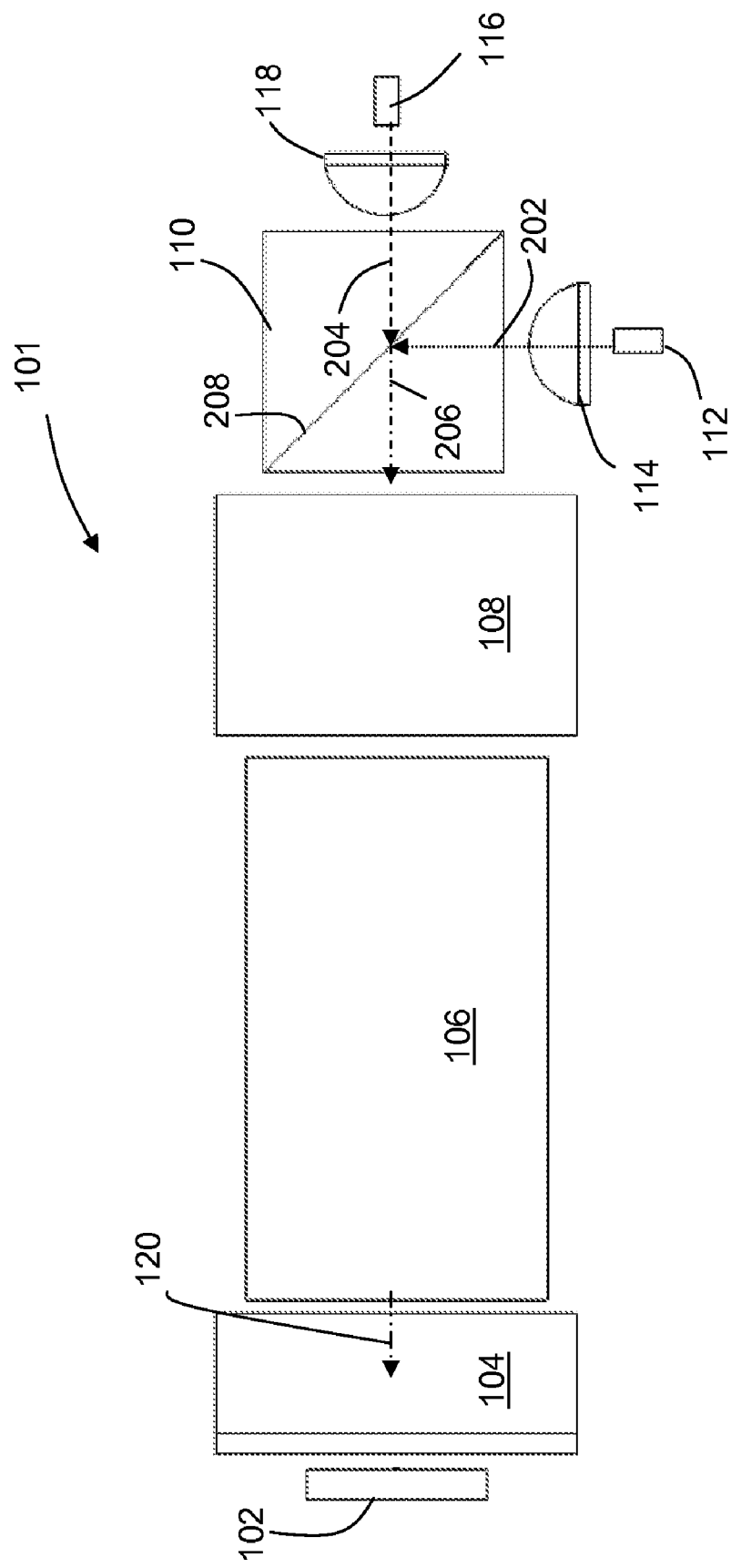
FIG. 2 is a top view of the plural wavelength light beam source of FIG. 1 according to an embodiment.
Figure 3:
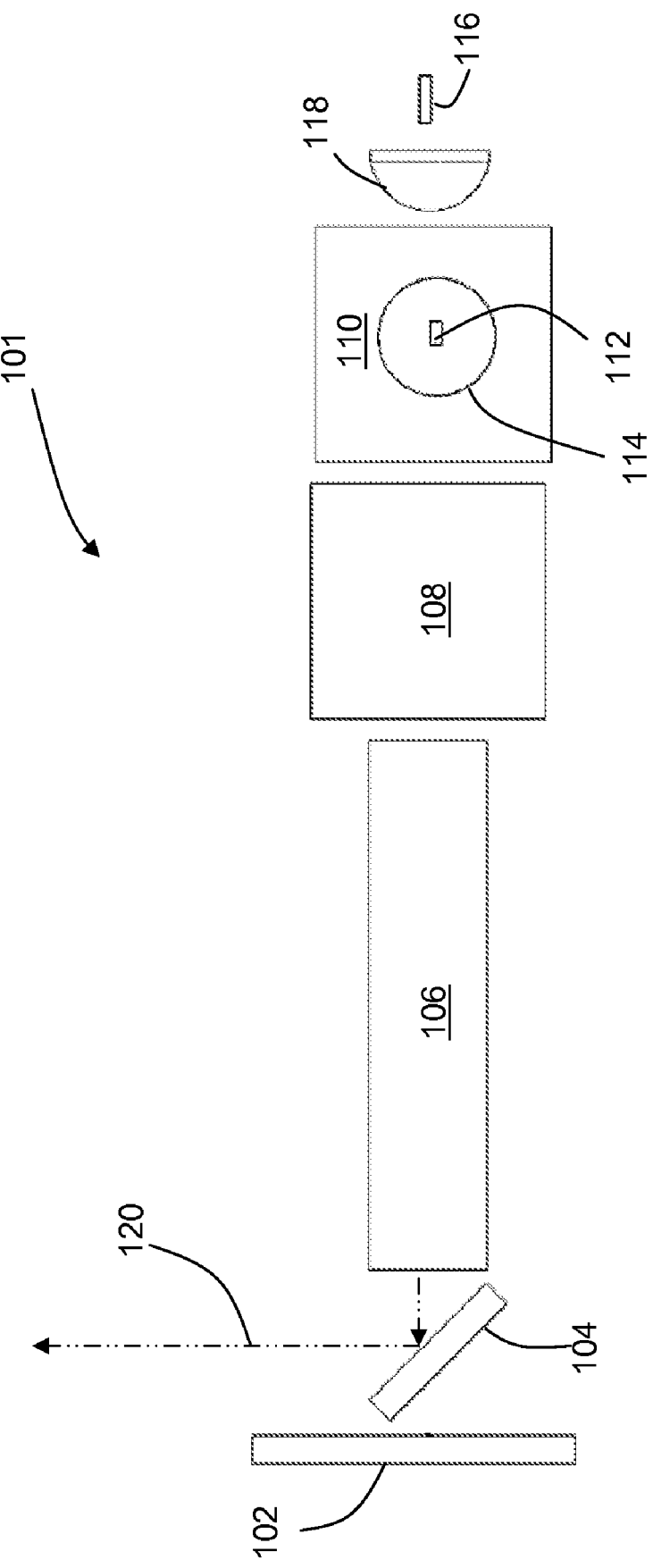
FIG. 3 is a side view of the plural wavelength light beam source of FIGS. 1 and 2 according to an embodiment.

FIGS. 1-3 are views of a plural wavelength light beam source 101 according to an embodiment.

A first wavelength light source 102 is operable to emit light at a first wavelength. According to some embodiments, the first wavelength is a long wavelength. According to some embodiments the first wavelength includes infrared light. The first wavelength light source 102 may be mounted on a heat sink (not shown). According to alternative embodiments, the first wavelength light source 102 may be of a type that directly emits the first wavelength light, such as a diode laser, a vertical cavity surface emitting laser (VCSEL), or a light emitting (non-lasing) diode. Alternatively, the first wavelength light source may itself be an optically-pumped source.

The first wavelength light is emitted toward a first selective mirror 104 that is configured to pass at least a portion of the first wavelength light. According to some embodiments, the first selective mirror 104 may be configured to substantially polarize the first wavelength light that passes through the first selective mirror. In such cases, the first selective mirror 104 may alternatively be referred to as a polarizer. The first selective mirror 104 may be aligned to receive the light at the first wavelength from the first wavelength source and operable to transmit polarized light at the first wavelength and reflect light at second, third, and fourth wavelengths.

After passing through the first selective mirror 104, the first wavelength light passes into a wavelength converter 106. Within the wavelength converter 106, first wavelength light is converted to a second wavelength. For example, the wavelength converter may be configured as a second harmonic generator (SHG) that doubles the frequency of the input light. Accordingly, the wavelength of the second wavelength may be half that of the first wavelength. According to one embodiment, an input beam at a first wavelength of 1064 nm is converted to a 532 nm green light second wavelength.

A second selective mirror 108 is aligned to receive light from the right end of the wavelength converter 106. The second selective mirror 108 is, according to some embodiments, configured to receive light at the first and second wavelengths that emerges from right end of the wavelength converter and reflect at least a portion of the light at the first and second wavelengths back through the wavelength converter. The second selective mirror 108 is also configured to pass light at third and fourth wavelengths (described below) through to the wavelength converter.

The second selective mirror 108 may typically have adjustable tip and tilt for aligning the input beam with the wavelength converter 106. According to an embodiment the second selective mirror may be comprised of a narrow band notch reflector configured to reflect nearly 100% of light at the intended first wavelength, with reflectance falling quickly and substantially to 0% for wavelengths that differ somewhat from the nominal first wavelength. The notch reflector may act to keep the excitation wavelength at a nominal wavelength, and hence maintain the second wavelength of the output beam, regardless of variations in output wavelength power distribution from the first wavelength light source 102. Such variations may arise for example from variable heating of the first wavelength light source 102 and may result in undesirable fluctuations in brightness unless corrected for.

A third wavelength light source 112 is operable to emit a beam of light 202 light at a third wavelength and a fourth wavelength source 116 is operable to emit light a beam of light 204 at a fourth wavelength. The third and fourth wavelength sources may for example include laser diodes. In some embodiments respective beam shaping elements 114 and 118 such as collimation lenses may be aligned to receive light from the third and fourth wavelength sources 112 and 116 and provide desired beam shapes.

A beam combiner 110 is configured to combine the third and fourth wavelength beams of light 202 and 204 into a first composite beam of light 206 and direct the composite beam of light through the second selective mirror 108. One way to combine the beams is to provide a pass-band filter on a combining surface 208. According to some embodiments, the pass-band filter may be configured as a low pass filter having a wavelength cut-off between the third and fourth wavelengths and the fourth wavelength light source 116 may be selected to emit a wavelength longer than the third wavelength light source 112. Alternatively, the pass-band filter may be configured as a high-pass filter having a wavelength cut-off between the third and fourth wavelengths and the fourth wavelength light source 116 may be selected to emit a wavelength shorter than the third wavelength light source 112. Alternative arrangements including a notch filter, a polarization-selective filter (such as a PBS), a half-mirror, an evanescent coupler, etc. may be used according to the preference of the designer.

The first, second, third, and fourth wavelength beams of light are directed right-to-left through the wavelength converter 106 and emerge from the left end of the wavelength converter. The first selective reflects at least the second, third, and fourth wavelength beams along an output axis as a composite output beam 120 with the output axis being substantially common.

Following output, the composite output beam 120 may pass through one or more optical elements such as, for example, an expander and focus lens to produce a desired spot size at one or more distances. The composite output beam 120 may be scanned across a field-of-view (FOV) by a beam scanner (not shown). For example, in a scanned beam image capture device such as a laser camera or a bar code scanner, the composite beam 120 may be substantially unmodulated to uniformly illuminate the FOV for detection of backscattered light by a light detector. Alternatively, the first wavelength source 102, third wavelength source 112, and fourth wavelength source 116 may be synchronously modulated to produce a modulated composite output beam 120. Such an arrangement may be especially appropriate for a scanned beam display or combination display and image capture device wherein a controller (not shown) may control the modulation of the light sources to produce pixels and form an image on the FOV.

According to some embodiments the second selective mirror may be configured as an external cavity mirror. In such embodiments, the first wavelength light source 102 may be equipped with a mirror to reflect first wavelength light that had previously traveled through the wavelength converter 106 back through the wavelength converter. In such instances, the composite beam light source 101 may comprise a SHG crystal laser light source operable to emit one of red, green, or blue light and at least one laser diode operable to emit another of red, green or blue light configured with an emission axis that passes through the SHG crystal. According to some embodiments, the system includes a SHG crystal laser light source operable to emit green light and two laser diodes operable to respectively emit red and blue light.

Figure 4:
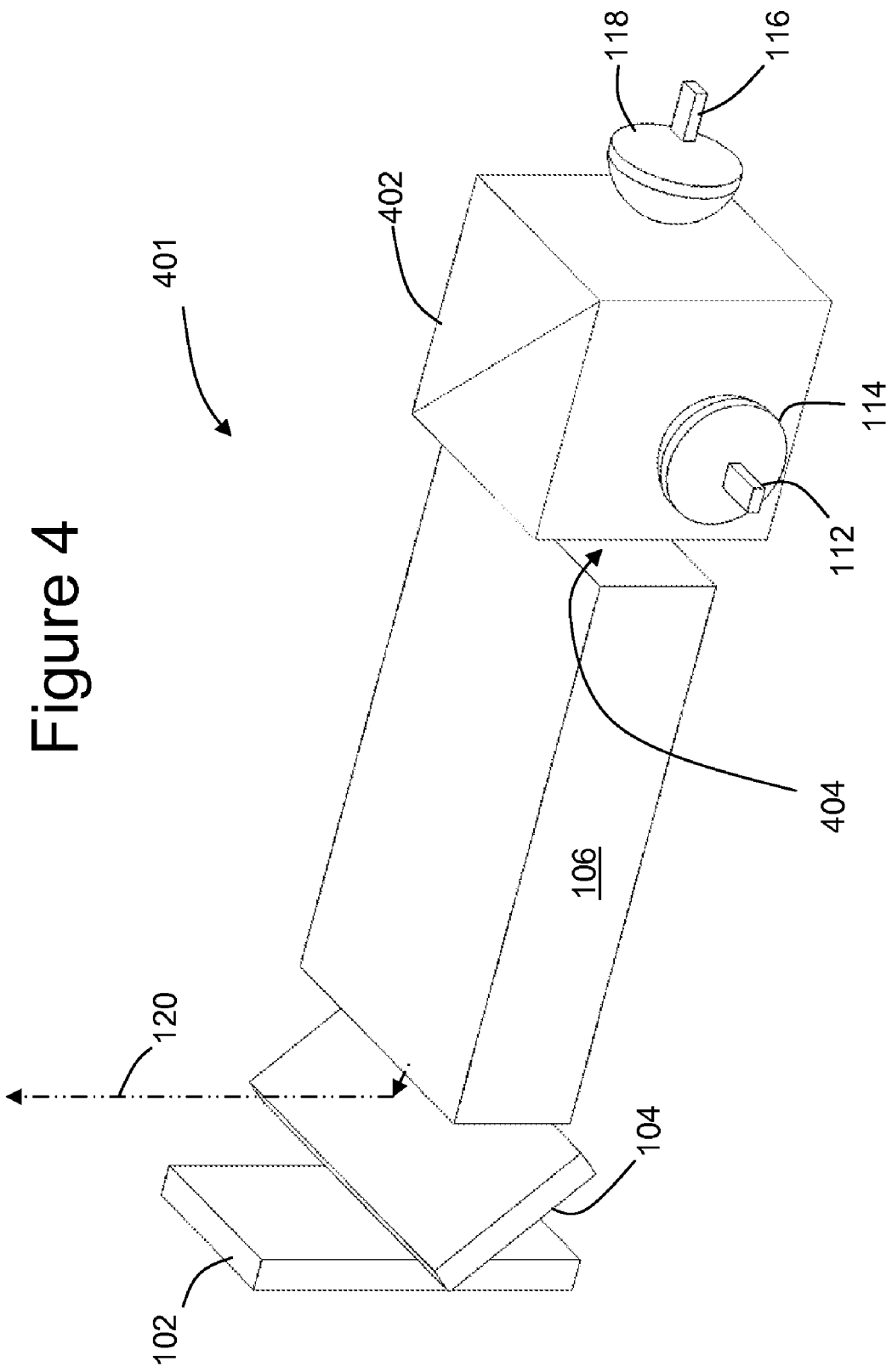
FIG. 4 is a perspective diagram of a plural wavelength light beam source according to another embodiment.
Figure 5:
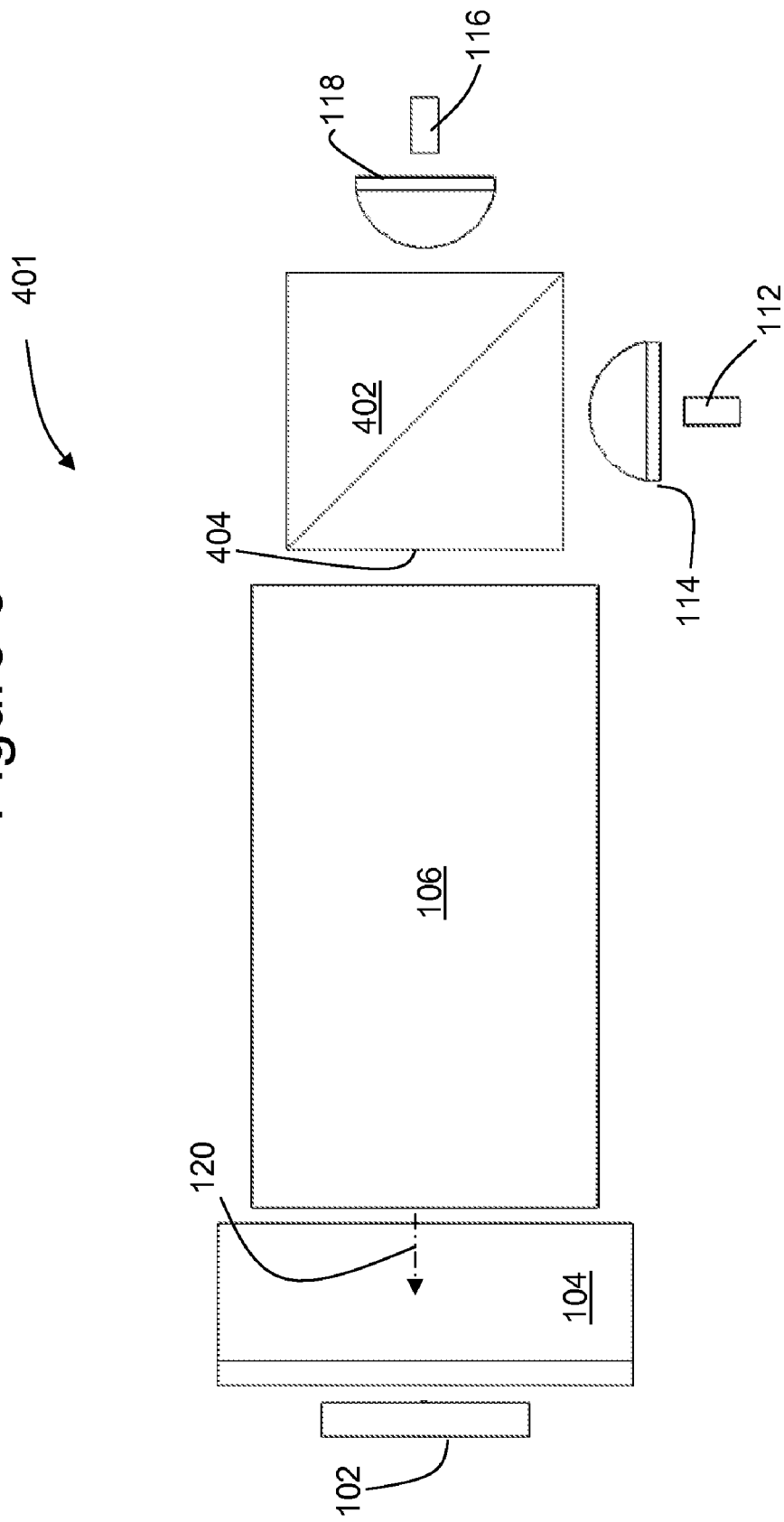
FIG. 5 is a top view of the plural wavelength light beam source of FIG. 3 according to an embodiment.
Figure 6:
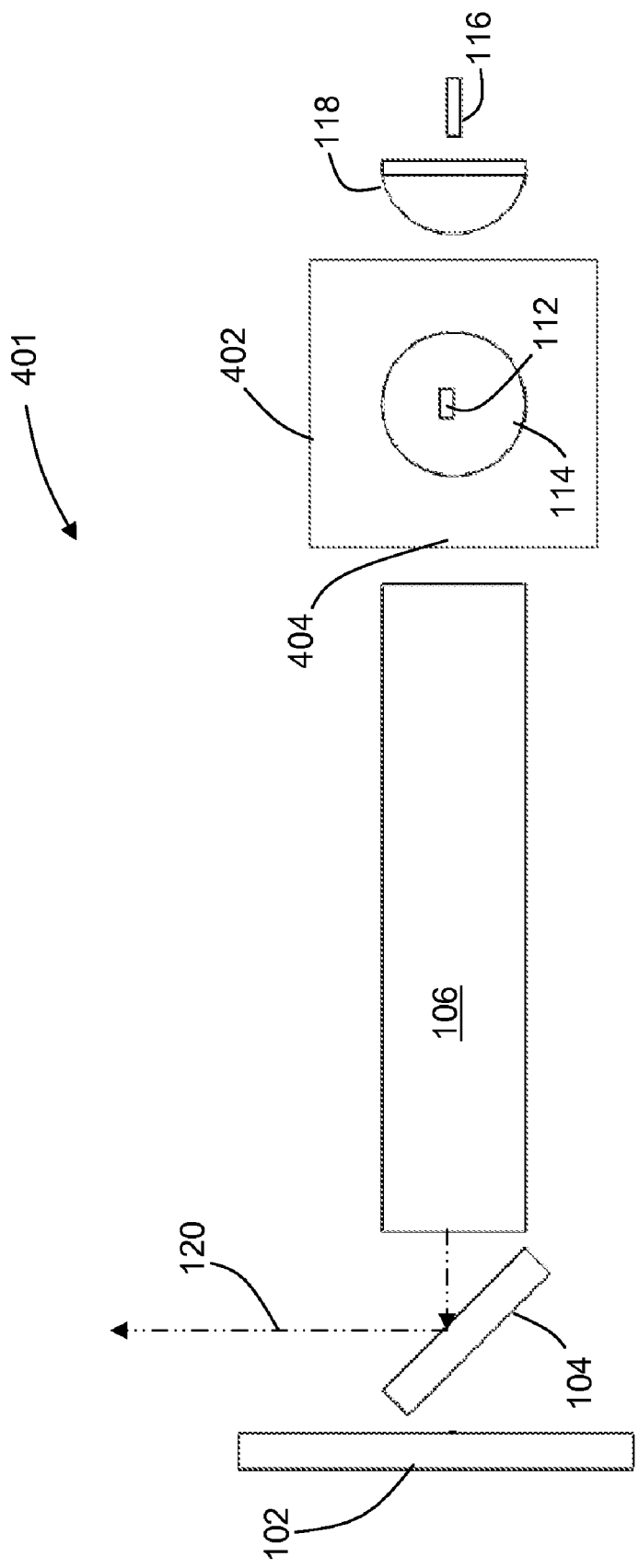
FIG. 6 is a side view of the plural wavelength light beam source of FIGS. 4 and 5 according to an embodiment.

FIGS. 4-6 are views of a plural wavelength light beam source 401 according to another embodiment. In this embodiment the separate second selective mirror 108 and beam combiner 110 may be replaced by an integrated beam combiner 402 that includes a second selective mirror 404. According to an embodiment, the second selective mirror is configured to reflect long wavelength light from the optical pump and the second wavelength light produced by the wavelength converter from the long wavelength light. The selective filter may be comprised of a volumetric Bragg reflector, a dichroic reflector, etc. The beam combiner 402 with its integrated selective reflector may be mounted to provide alignment adjustability. In particular, two degrees of freedom including tip up and down and tilt left to right may be provided to ensure that the reflected long wavelength light is aligned with a reflector included in the optical pump 102. The beam combiner may further allow alignment of the second, third, and fourth wavelengths of light are aligned with the polarizer 104 to provide a desired axis for the composite output beam 120.

According to some embodiments the second selective mirror may be configured as an external cavity mirror as described above.

Figure 7:
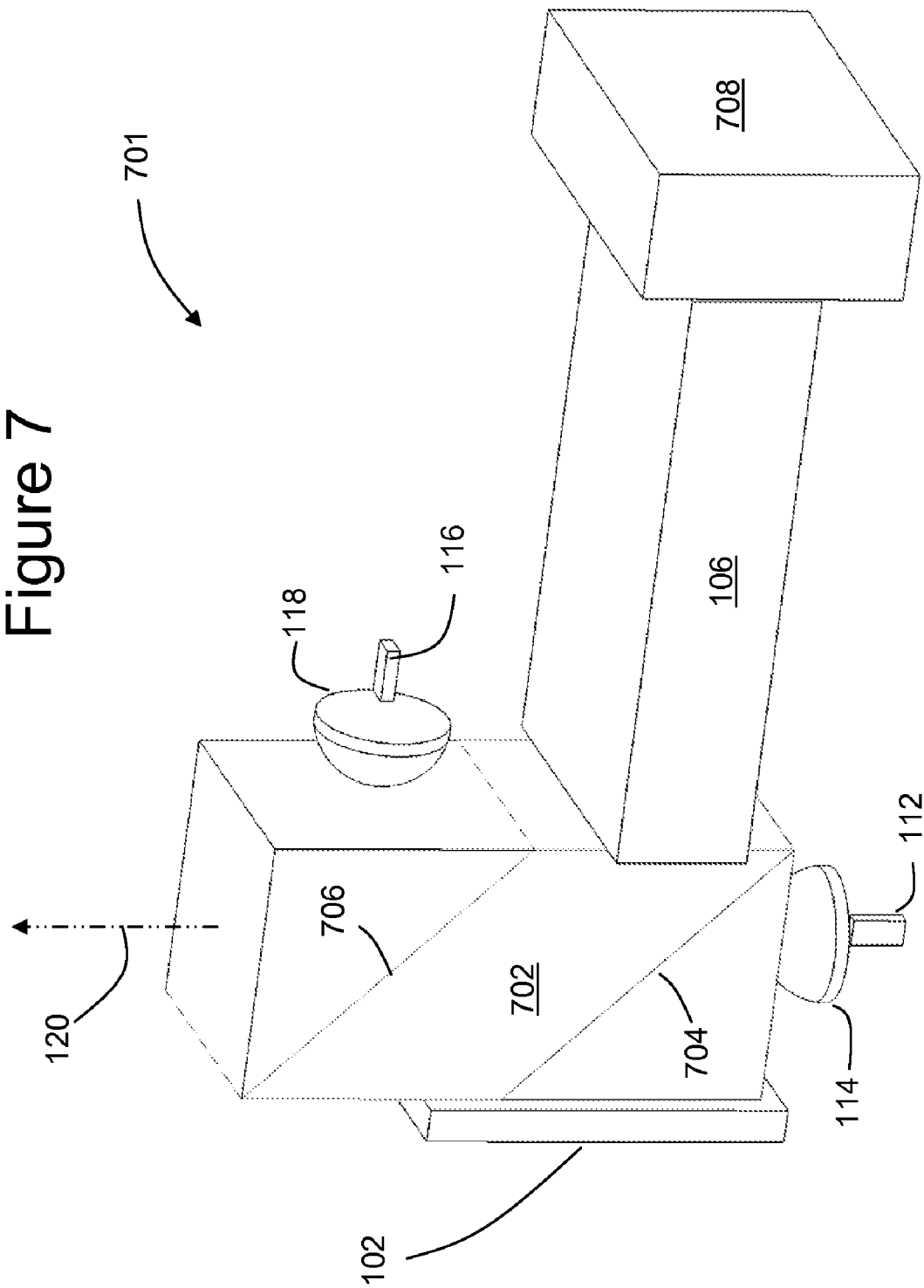
FIG. 7 is a perspective diagram of a plural wavelength light beam source according to another embodiment.
Figure 8:
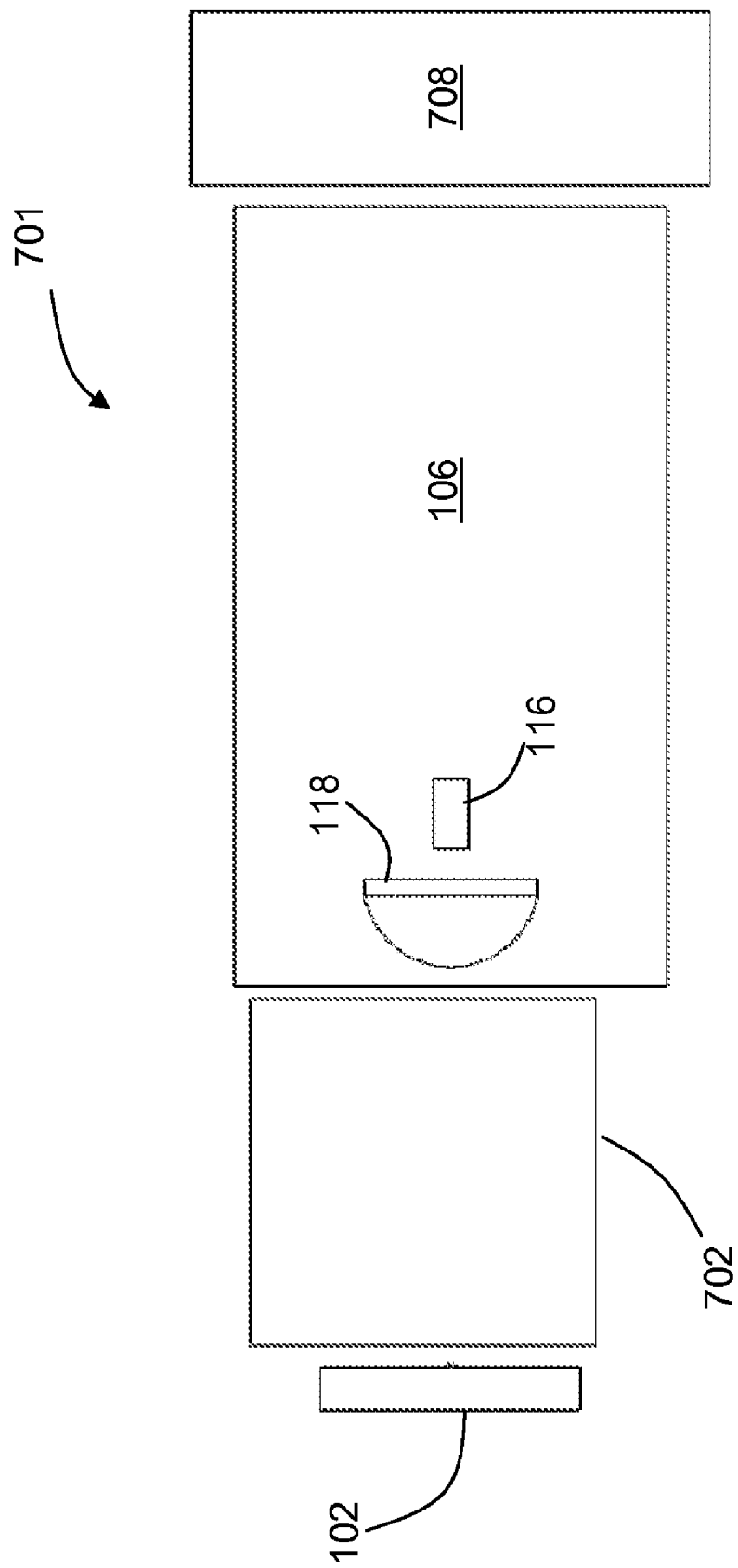
FIG. 8 is a top view of the plural wavelength light beam source of FIG. 7 according to an embodiment.
Figure 9:
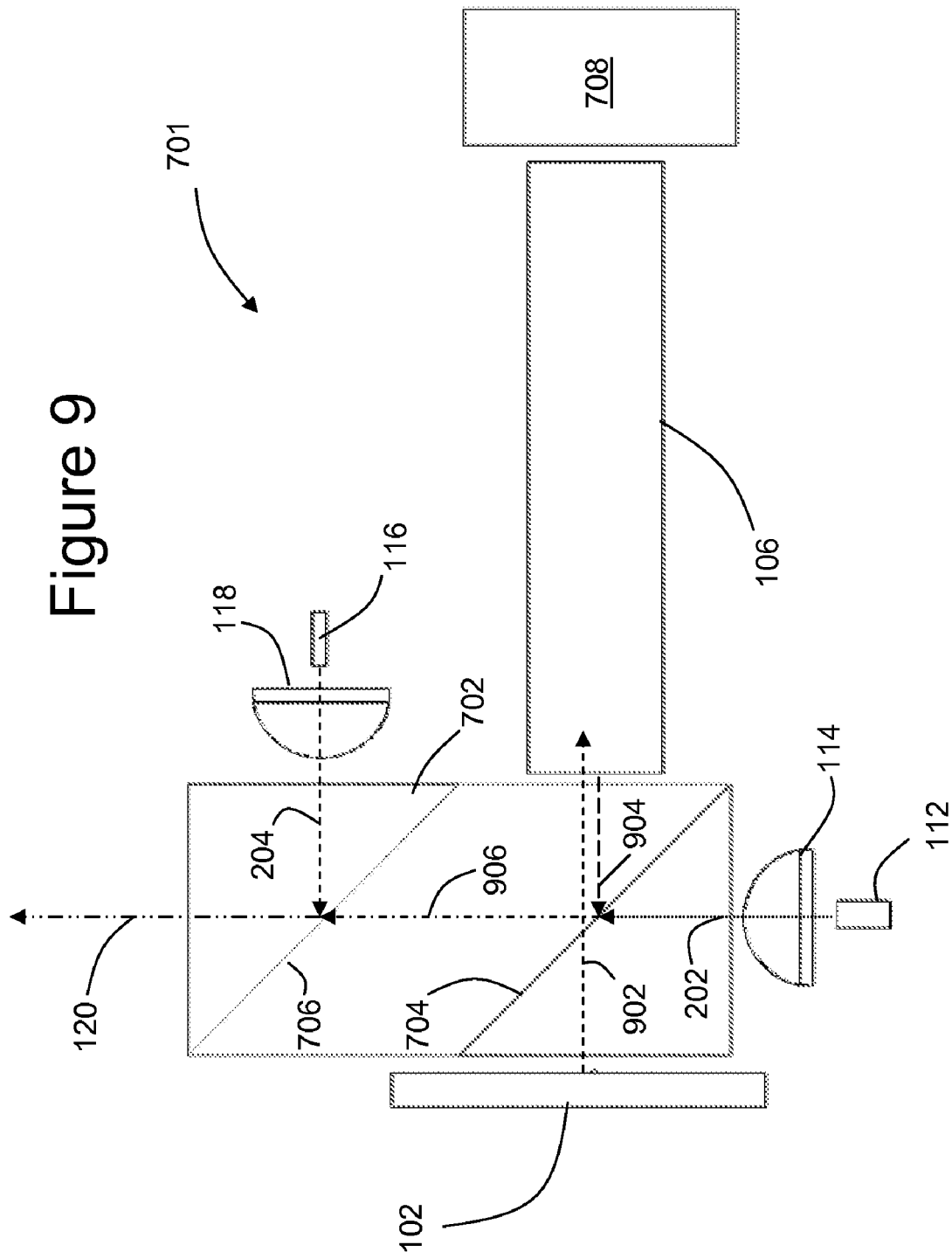
FIG. 9 is a side view of the plural wavelength light beam source of FIGS. 7 and 8 according to an embodiment.

FIGS. 7-9 are diagrams of an integrated beam source 701 according to another embodiment. An infrared light source 102 is operable to emit modulated infrared light. A beam combiner 702 is aligned to receive the modulated infrared light from the infrared light source 102. According to some embodiments, the beam combiner 702 may include first and second surfaces aligned to receive modulated infrared light from the infrared light source, wherein the first surface includes a polarizer configured to polarize the infrared light and the second surface includes a first pass-band filter configured to pass infrared light, reflect light at a second wavelength, and pass light at a third wavelength. The first and second surfaces may be configured as separate surface such as, for example, the first surface being arranged adjacent to the infrared light source 102 and the second surface being configured at surface 704. Alternatively, the first and second surfaces may be configured to fall substantially coplanar at surface 704. This may be done, for example, by forming a polarizer on one substrate, forming a pass-band filter on a second substrate, and fusing the substrates with the polarizer and pass-band filter surfaces facing one another. The combined substrates may then be diced and polished or otherwise singulated into individual beam combiners 702.

In alternative embodiments, the polarizer function of the beam combiner 702 may be deleted.

Following passage through the beam combiner, the infrared beam 902 from the infrared light source 102 passes into the wavelength converter 106 where it is converted into light at a second wavelength. In applications where the infrared light source 102 is modulated, the second wavelength light produced in the wavelength converter 106 may be correspondingly modulated. The infrared light 902 and the produced second wavelength light pass through the wavelength converter 106 and impinge upon a mirror 708 aligned to receive the modulated infrared light and the modulated light at a second wavelength from the wavelength converter and are reflected thereby back through the wavelength converter 106.

According to some embodiments, the second wavelength light is substantially half the wavelength of the infrared light.

After passing back through the wavelength converter, a beam 904 containing both the infrared and second wavelength light impinges upon surface 704 of the beam combiner 702 where the infrared light is allowed to pass through and the second wavelength light is reflected as a beam along an axis 906.

According to some embodiments, a third wavelength light source 112 is operable to emit modulated light 202 at the third wavelength toward the surface 704 of the beam combiner 702. In such embodiments, the surface 704 of the beam combiner may be configured as a low-pass filter having a wavelength cutoff between the second wavelength and the third wavelength, thus allowing both the infrared light and the second wavelength to pass through, while reflecting the second wavelength. In such cases, a first composite beam 906 may be produced that includes the second wavelength light and the third wavelength light. For example, the second wavelength may include green light and the third wavelength may include red light. According to some embodiments, the green light includes 532 nm light and the red light includes 650 nm light. Thus a cutoff wavelength of between a little more than 532 nm and a little less that 650 nm may be appropriate.

According to some embodiments, the integrated beam source 701 may include a fourth wavelength light source operable to produce a modulated beam of light at a fourth wavelength, such as blue around 450 nm for example. In such embodiments, the beam combiner 702 may include a surface 706 aligned to receive the first composite modulated light beam 906 from the second surface and a modulated beam of light 204 at the fourth wavelength from the fourth wavelength light source 116. The surface 706 may be configured to pass the first composite modulated light beam 906 and reflect the fourth wavelength modulated light beam 204 along a common axis as a second composite modulated light beam 120 as indicated. In such a case, the surface 706 may include a low pass filter having a cutoff wavelength between the second wavelength and the fourth wavelength.

Alternatively, the surface 706 may include a high pass filter having a cutoff wavelength between the second wavelength and the fourth wavelength. In such a case, the second composite beam of light is directed coaxial with the fourth wavelength input beam 204, emerging from the left face of the beam combiner 702.

The mirror 708 may optionally be configured as a selective mirror. For example, the mirror 708 may be configured as a narrow band reflector operative to reflect only a narrow band of wavelengths near the nominal or desired first wavelength.

Such an arrangement may be useful, for example, for providing a stable first wavelength, and hence for maintaining a stable second wavelength.

The mirror 708 may be configured to reflect substantially all the second wavelength light or alternatively may be configured to pass second wavelength light to produce a separate second wavelength beam (not shown) emitted along an axis separate from the composite beam 120. The separate second wavelength beam may subsequently be recombined with or used in addition to the composite beam to increase brightness and/or efficiency of the second wavelength output.

Figure 10:
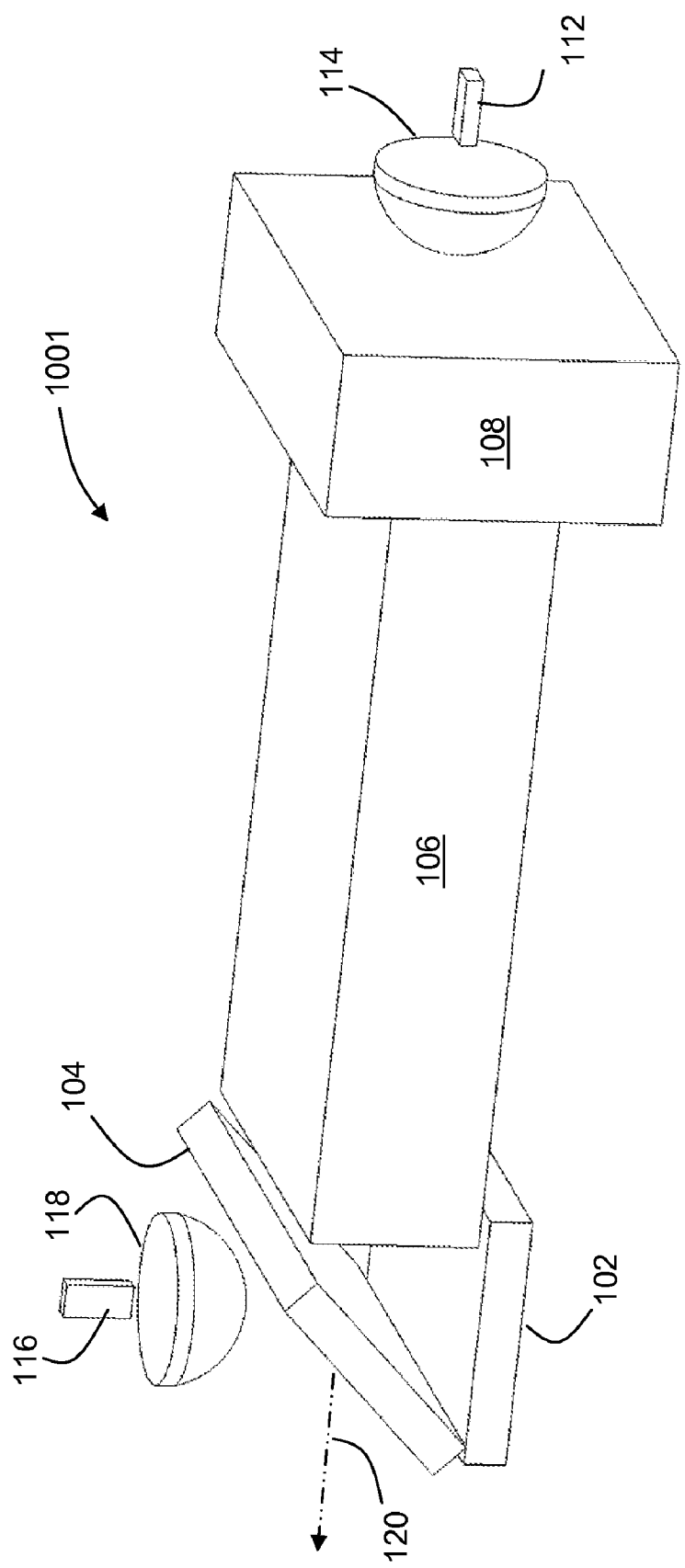
FIG. 10 is a perspective diagram of a plural wavelength light beam source according to another embodiment.
Figure 11:
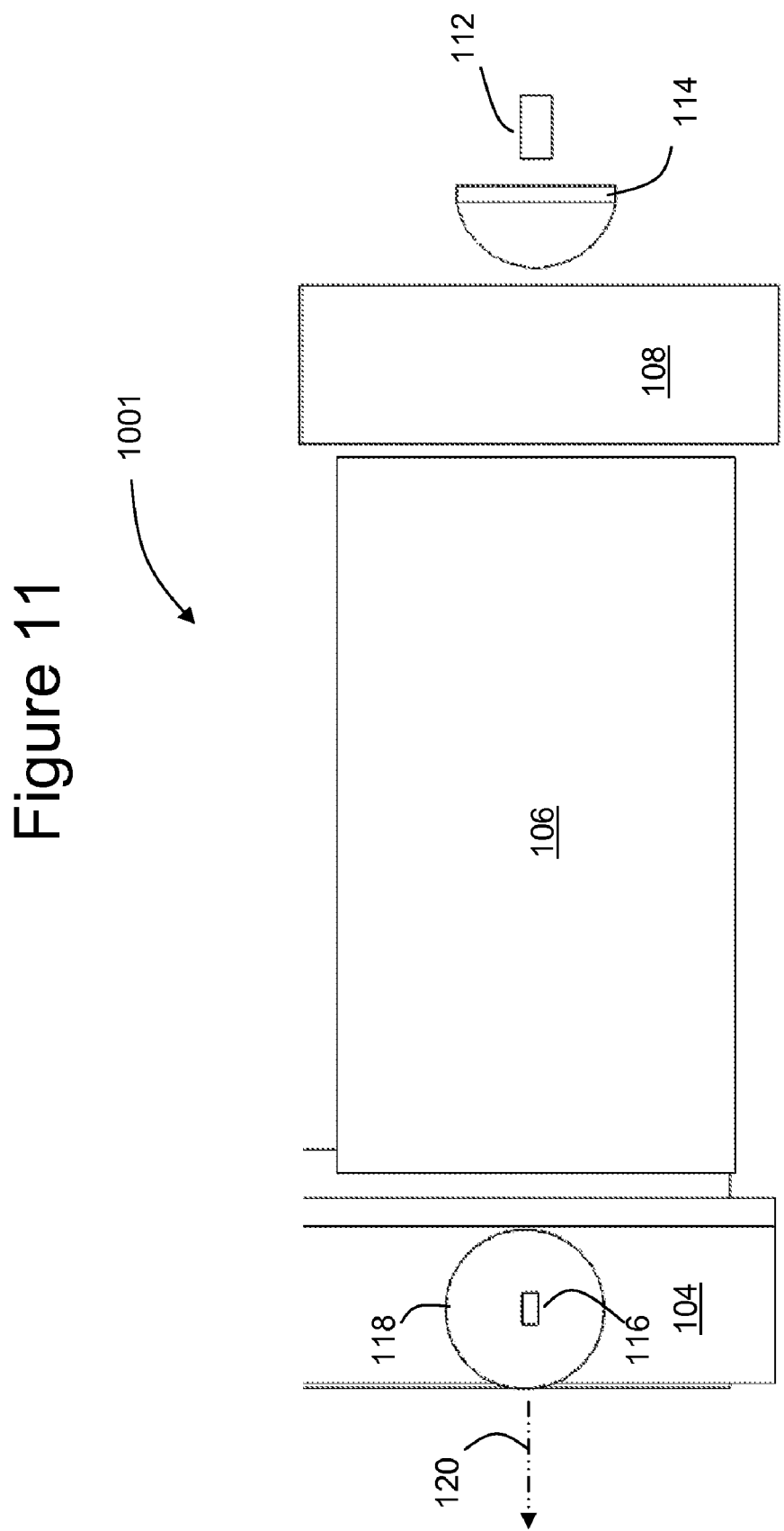
FIG. 11 is a top view of the plural wavelength light beam source of FIG. 10 according to an embodiment.
Figure 12:
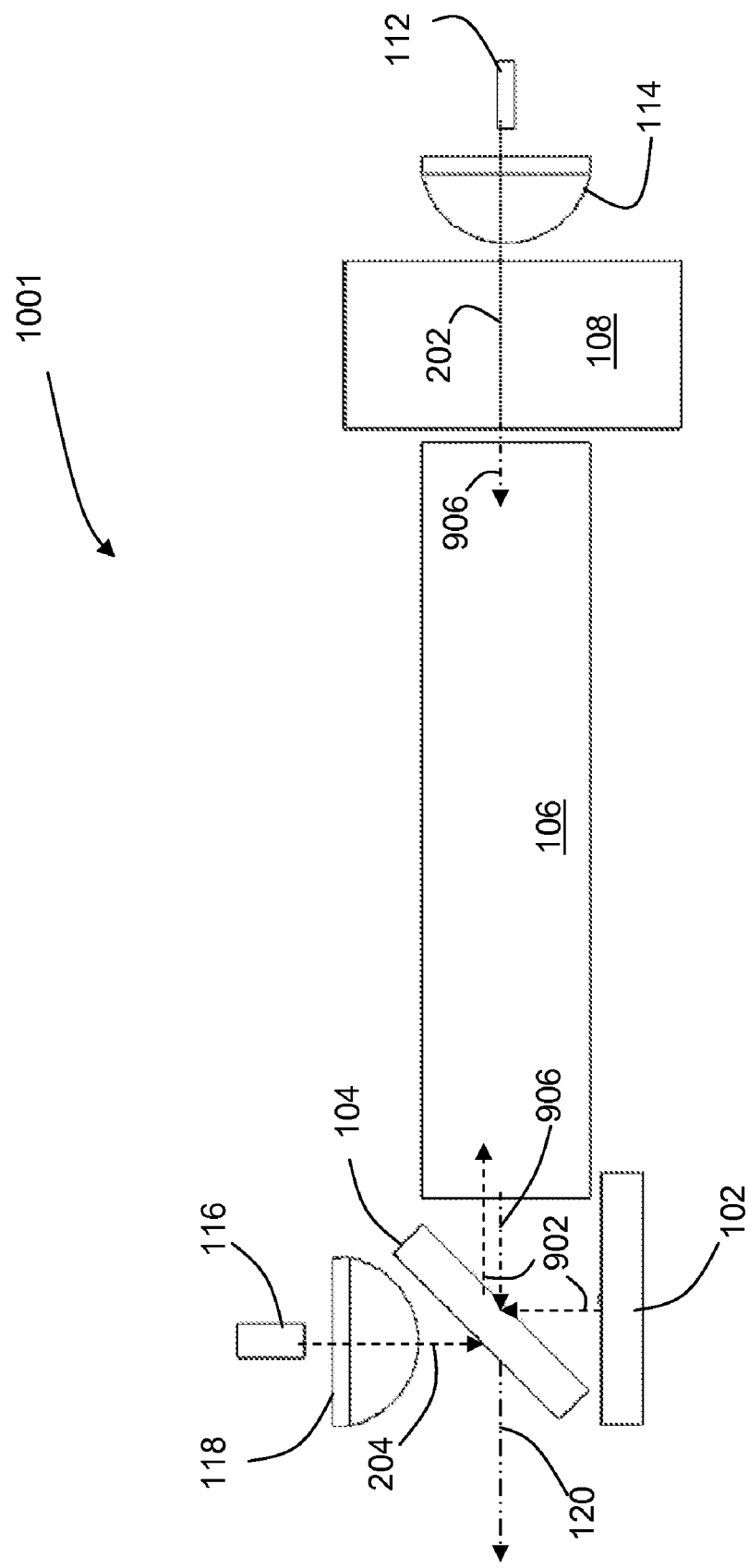
FIG. 12 is a side view of the plural wavelength light beam source of FIGS. 10 and 11 according to an embodiment.

FIGS. 10-12 are diagrams of a composite beam source 1001 according to another embodiment. The composite beam source 1001 includes a first wavelength source 102 operable to produce light 902 at a first wavelength. A first selective mirror 104 aligned to receive light 902 from the first wavelength source and direct light at the first wavelength along a first axis toward a wavelength converter 106 aligned to receive light 902 at the first wavelength from the first selective mirror 104. The wavelength converter 106 is configured to convert the first wavelength light to second wavelength light. After passing through the wavelength converter, the first wavelength light and the second wavelength light impinge upon a second selective mirror 108. The second selective mirror 108 is aligned to receive first wavelength light and second wavelength light from the wavelength converter 106 and reflect the first wavelength and second wavelength light back toward the wavelength converter.

The composite beam source also includes a third wavelength source 112 operable to produce light 202 at a third wavelength and aligned to direct the third wavelength light toward the second selective mirror 108. The second selective mirror 108 is further configured to pass third wavelength light 202 toward the wavelength converter along the first axis, where the first wavelength, second wavelength, and third wavelength light travel together through the wavelength converter 106 and emerge as a first composite beam of light 906 at the left end thereof.

A fourth wavelength source 116 is operable to produce light 204 at a fourth wavelength and aligned to direct the fourth wavelength light toward the first selective mirror 104.

The first selective mirror 104 is configured to direct the second, third, and fourth wavelengths of light along a common axis as a composite beam of light 120 by passing the second and third wavelengths and reflecting the fourth wavelength as indicated. Additionally, the selective mirror is configured to reflect the first wavelength light back toward the first wavelength source 102, where it may be reflected and again circulated through the wavelength converter 106.

As indicated, the composite beam source includes a first wavelength source is aligned to emit the first wavelength light 902 along a second axis and the first selective mirror 104 is configured to reflect the first wavelength light along the first axis that passes through the wavelength converter 106. According to some embodiments, the composite beam source includes a fourth wavelength source aligned to emit the fourth wavelength light 204 along a third axis and the first selective mirror 104 is configured to reflect the fourth wavelength light along the first axis away from the wavelength converter 106.

In the composite beam source 1001 the second and third axes are parallel and the first axis is substantially orthogonal to the third axis. In other words, the first selective mirror 104 is configured to reflect light at the first and fourth wavelengths and pass light at the second and third wavelengths. According to some embodiments, the first selective mirror 104 is further configured to polarize received light at the first wavelength.

Light at the first, second, and third wavelengths passes through the wavelength converter 106.

Figure 13:
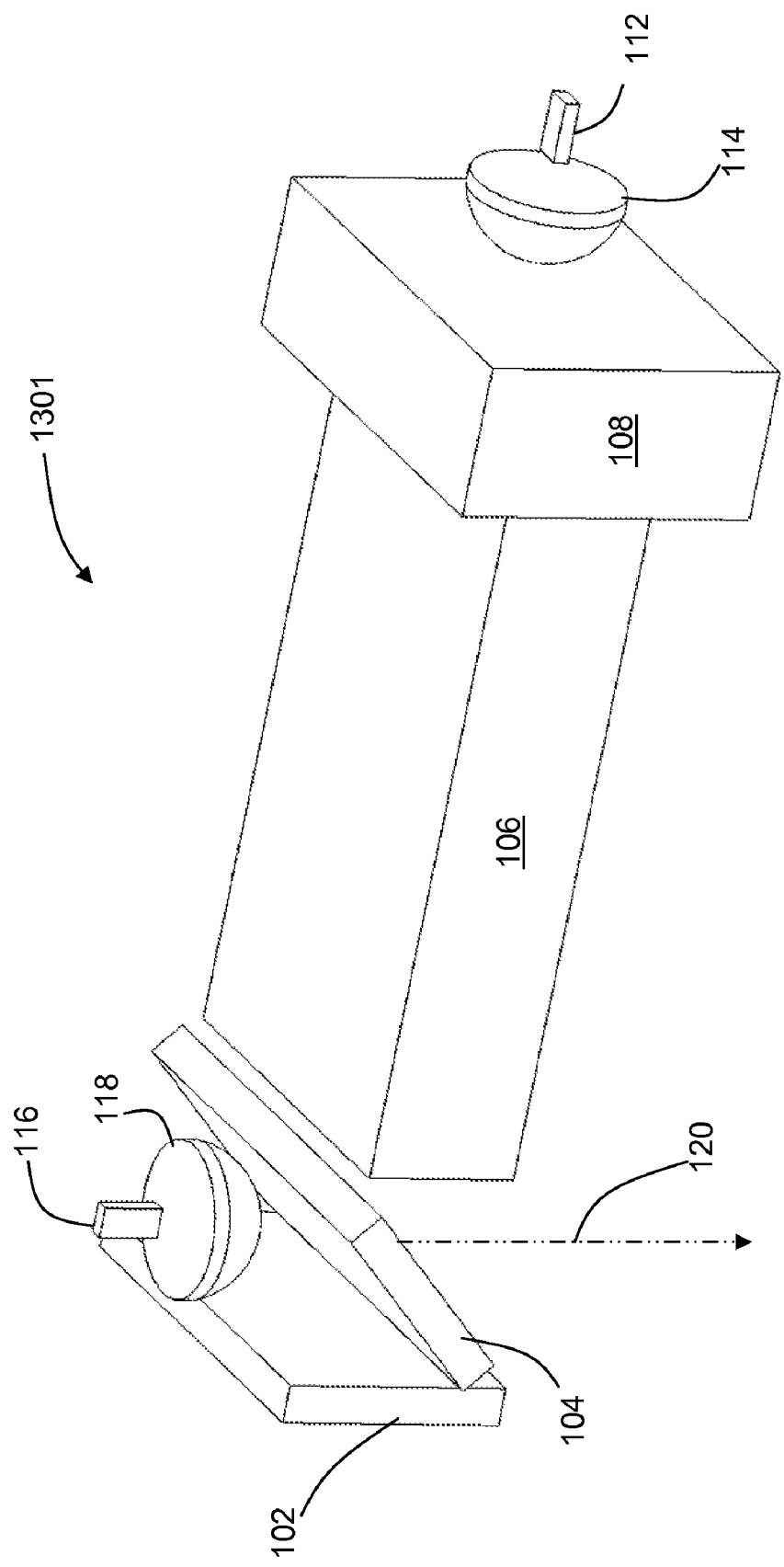
FIG. 13 is a perspective diagram of a plural wavelength light beam source according to another embodiment.
Figure 14:
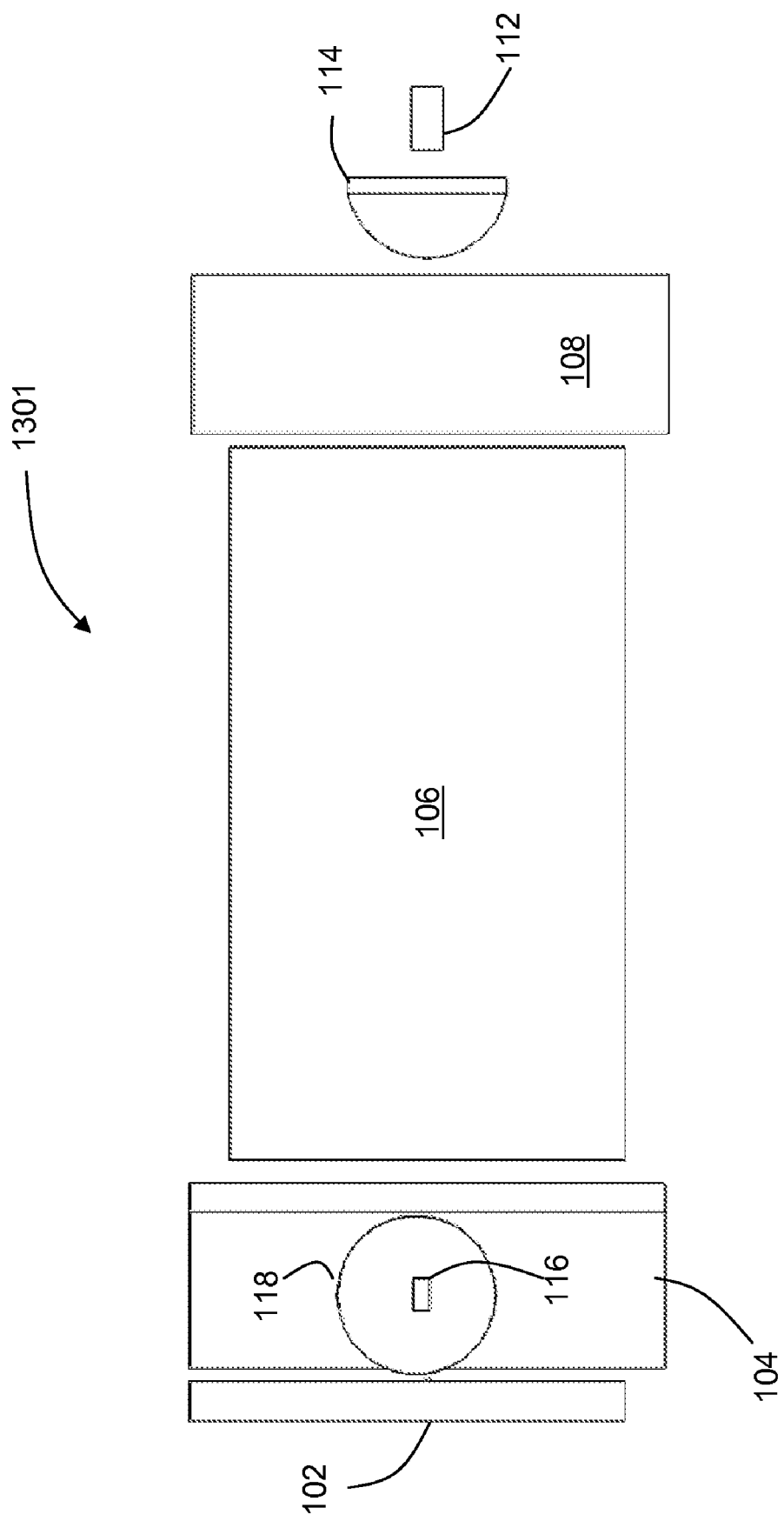
FIG. 14 is a top view of the plural wavelength light beam source of FIG. 13 according to an embodiment.
Figure 15:
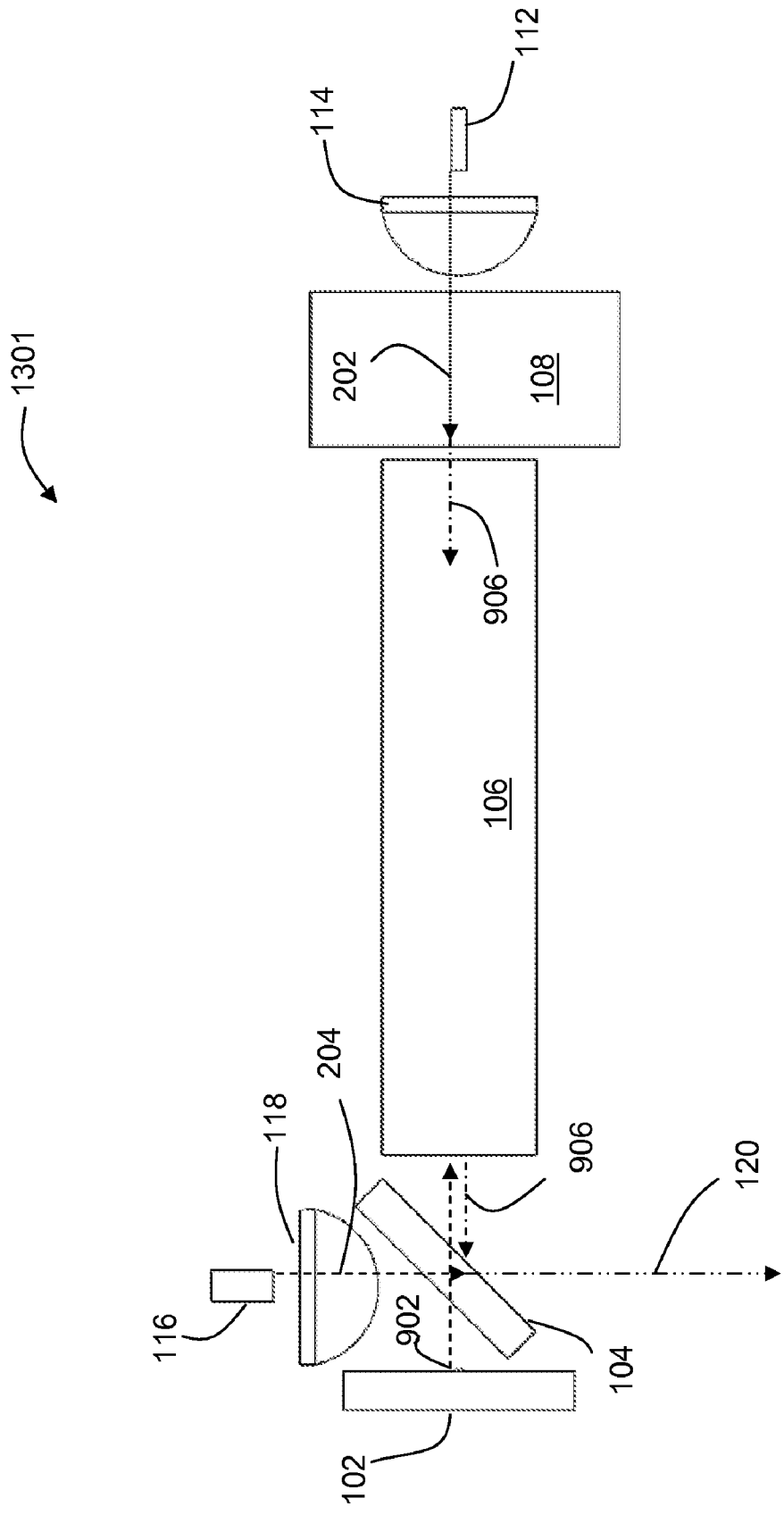
FIG. 15 is a side view of the plural wavelength light beam source of FIGS. 13 and 14 according to an embodiment.

FIGS. 13-15 are diagrams of a composite beam source 1301 according to another embodiment wherein the first wavelength source is aligned to emit the first wavelength light 902 along the first axis and the first selective mirror is configured to pass respective light beams 902 and 204 at the first and fourth wavelengths and to reflect a light beam 906 containing the second and third wavelengths.

Referring to FIG. 16, any one, or combination of one or more, of the apparatus and methods described above and shown in FIGS. 1-15 may be incorporated into a device 214. The device 214 may include a wireless device cell phone, a portable DVD player, a portable television device, a laptop, a portable e-mail device, a portable music player, a personal digital assistant, or any combination of the same.

The device 214 may include a projector 216 incorporating any one or more of the foregoing beam source apparatus. The projector 216 is coupled to a processor 218 programmed to control the projector, including the laser and the scanner and any actively driven components as described hereinabove. The processor 218 may be coupled to a memory 220 storing image data 222, which may include both still image and video data. The processor 218 may be programmed to process the image data to generate control signals causing the projector 216 to create an image corresponding to the image data 222 on the screen 232. The processor 218 may also be coupled to one or more input and output devices. For example a screen 224, such as an LCD screen 224, may enable a user to view the status of operation of the processor 218 and may serve as an alternative means for displaying the image data 222. In some embodiments, the screen 224 is a touch screen for receiving user inputs. The LCD screen 224 is optional and is not required to practice the above embodiments. The processor 218 may also be coupled to a keypad 226 for receiving user inputs. A speaker 228 may be coupled to the processor 218 for providing alerts and instructions to a user. The speaker 228 may also present audio data corresponding to video image data 222. An antenna 230 may be coupled to the processor 218 for sending and receiving information. Although the antenna 218 is drawn as extending outside of device, it should be understood that antenna may be housed inside of device and may be positioned anywhere within the device.

The preceding overview, brief description of the drawings, and detailed description describe exemplary embodiments according to the present invention in a manner intended to foster ease of understanding by the reader. Other structures, methods, and equivalents may be within the scope of the invention. For example, methods and physical embodiments may be combined or used singly.

Additionally, light sources may include a number of different technologies including light emitting diodes, incandescent sources, fluorescent sources, laser diodes, gas lasers, etc. Accordingly, except where noted, terms such as light source or laser should be regarded as referring broadly to such sources.

While the terms "light" and "light beam" are used, it should be recognized that "light" corresponds to a range of electromagnetic energies that extends beyond wavelengths that may be typically detected by human vision. Except where noted, "light" should be read to encompass a range of wavelengths broader than the visible spectrum.

As such, the scope of the invention described herein shall be limited only by the claims.

What is claimed is:

1. A plural-wavelength light source comprising:
    a first wavelength source operable to emit light at a first wavelength;
    a polarizer aligned to receive the light at the first wavelength from the first wavelength source and operable to transmit polarized light at the first wavelength and reflect light at second and third wavelengths;
    a wavelength converter aligned to receive the first wavelength of light from the polarizer and configured to convert the first wavelength of light to the second wavelength of light;
    a cavity mirror aligned to receive light at the first and second wavelengths from the wavelength converter and configured to reflect light at the first and second wavelengths toward the wavelength converter; and
    a third wavelength source operable to emit light at a third wavelength through the cavity mirror and through the wavelength converter, wherein the polarizer is aligned to receive light at the second and third wavelengths from the wavelength converter and configured to direct light at the second and third wavelengths along an output axis as a composite beam of light.

2. The plural-wavelength light source of claim 1 further comprising:
    a beam combiner aligned to receive light from the third wavelength source and launch the received third wavelength of light toward the cavity mirror and wavelength converter.

3. The plural-wavelength light source of claim 2 further comprising:
    a fourth wavelength source operable to emit light at a fourth wavelength;
    wherein the beam combiner is further configured to receive light from the fourth wavelength source and launch the combined third and fourth wavelengths of light toward the cavity mirror and wavelength converter; and
    wherein the polarizer is aligned to receive light at the second, third, and fourth wavelengths from the wavelength converter and direct light at the second, third, and fourth wavelengths along an output axis as a composite beam of light.

4. The plural-wavelength light source of claim 1 wherein the first and third wavelength sources are operable to modulate in intensity the first and third emitted wavelengths of light; and
    wherein the composite beam of light includes modulated light at the second and third wavelengths.

5. The plural wavelength light source of claim 1 wherein the cavity mirror includes a narrow band reflector configured to reflect light at the first wavelength.

6. The plural wavelength light source of claim 1 wherein the cavity mirror is configured to pass light at the third wavelength.

7. A composite beam light source comprising:
    an optical pump operable to emit long wavelength light;
    a polarizer aligned to receive the long wavelength light and configured to transmit polarized long wavelength light and reflect light at second and third wavelengths;
    a wavelength converter aligned to receive the polarized long wavelength light from the polarizer and configured to convert the long wavelength light to a second wavelength of light; and
    a beam combiner configured to:
    a) receive the long wavelength and the second wavelength light from the wavelength converter and reflect the long wavelength and second wavelength light back through the wavelength converter, and b) receive light at a third wavelength and direct the received third wavelength of light through the wavelength converter.

8. The composite beam light source of claim 7 further comprising a light source operable to emit the light at the third wavelength.

9. The composite beam light source of claim 7 wherein the long wavelength light includes infrared light;
the second wavelength is half the wavelength of at least apportion of the infrared light; and
the third wavelength includes visible light.

10. The composite beam light source of claim 7 wherein the beam combiner includes a volumetric Bragg reflector configured to selectively reflect the long wavelength of light and the second wavelength of light.

11. The composite beam light source of claim 7 wherein the beam combiner includes a surface having a dichroic coating configured to selectively reflect the long wavelength of light and the second wavelength of light.

12. The composite beam light source of claim 7 wherein the beam combiner includes a mount with at least one of tip or tilt adjustability operable to adjust the alignment of the reflected light with the wavelength converter.

13. The composite beam light source of claim 7 wherein the polarizer is aligned to receive light at the second and third wavelengths from the wavelength converter and configured to direct light at the second and third wavelengths along an output axis as a composite beam of light.

14. The composite beam light source of claim 7 wherein the polarizer includes a long pass filter configured to reflect visible light and pass the long wavelength light.

15. The composite beam light source of claim 7 wherein the polarizer is configured to transmit S-polarized long wavelength light.

16. An integrated beam source comprising:
an infrared light source operable to emit modulated infrared light;
a beam combiner having first and second surfaces aligned to receive modulated infrared light from the infrared light source, wherein the first surface includes a polarizer configured to polarize the infrared light and the second surface includes a first pass-band filter configured to pass infrared light, reflect light at a second wavelength, and pass light at a third wavelength;
a wavelength converter aligned to receive polarized modulated infrared light from the beam combiner and configured to convert the received modulated infrared light to modulated light at a second wavelength;
a mirror aligned to receive the modulated infrared light and the modulated light at a second wavelength from the wavelength converter and configured to reflect the infrared and second wavelength light toward the wavelength converter; and
a third wavelength light source operable to emit modulated light at the third wavelength toward the second surface of the beam combiner, whereby the second surface of the beam combiner is configured to pass the third wavelength modulated light and reflect the second wavelength modulated light along a common axis as a first composite modulated light beam.

17. The integrated beam source of claim 16 wherein the first surface and second surface of the beam combiner are separate surfaces.

18. The integrated beam source of claim 16 wherein the first surface and second surface of the beam combiner are substantially coplanar.

19. The integrated beam source of claim 16 wherein the second wavelength is substantially half the wavelength of the infrared light.

20. The integrated beam source of claim 16 wherein the first pass band filter includes a low-pass filter having a wavelength cutoff between the second wavelength and the third wavelength.

21. The integrated beam source of claim 20 wherein the second wavelength includes green light and the third wavelength includes red light.

22. The integrated beam source of claim 16 further comprising:
a fourth wavelength light source operable to produce a modulated beam of light at a fourth wavelength; and wherein
the beam combiner includes a third surface aligned to receive the first composite modulated light beam from the second surface and the modulated beam of light at the fourth wavelength from the fourth wavelength light source, the third surface being configured to pass the first composite modulated light beam and reflect the fourth wavelength modulated light beam along a common axis as a second composite modulated light beam.

23. The integrated beam source of claim 16 wherein the third surface of the beam combiner includes a low pass filter having a cutoff wavelength between the second wavelength and the fourth wavelength.

24. A composite beam source comprising:
a first wavelength source operable to produce light at a first wavelength;
a first selective mirror aligned to receive light from the first wavelength source and direct light at the first wavelength along a first axis;
a wavelength converter aligned to receive light at the first wavelength from the first selective mirror and configured to convert the first wavelength light to second wavelength light;
a second selective mirror aligned to receive first wavelength light and second wavelength light from the wavelength converter and configured to reflect first wavelength and second wavelength light toward the wavelength converter and to pass third wavelength light toward the wavelength converter along the first axis;
a third wavelength source operable to produce light at a third wavelength and aligned to direct the third wavelength light toward the second selective mirror and the wavelength converter; and
a fourth wavelength source operable to produce light at a fourth wavelength and aligned to direct the fourth wavelength light toward the first selective mirror, wherein the first selective mirror is configured to direct the second, third, and fourth wavelengths of light along a common axis as a composite beam of light.

25. The composite beam source of claim 24 wherein the first wavelength source is aligned to emit the first wavelength light along a second axis and the first selective mirror is configured to reflect the first wavelength light along the first axis.

26. The composite beam source of claim 25 wherein the fourth wavelength source is aligned to emit the fourth wavelength light along a third axis and the first selective mirror is configured to reflect the fourth wavelength light along the first axis away from the wavelength converter.

27. The composite beam source of claim 26 wherein the second and third axes are parallel and the first axis is substantially orthogonal to the second and third axes.

28. The composite beam source of claim 24 wherein the first selective mirror is configured to reflect light at the first and fourth wavelengths and pass light at the second and third wavelengths.

29. The composite beam source of claim 24 wherein the first selective mirror is further configured to polarize received light at the first wavelength.

30. The composite beam source of claim 24 wherein the first wavelength source is aligned to emit the first wavelength light along the first axis and the first selective mirror is configured to pass light at the first and fourth wavelengths and to reflect light at the second and third wavelengths.

31. The composite beam source of claim 24 wherein light at the first, second, and third wavelengths pass through the wavelength converter.

* * * * *